(12) United States Patent
Camras et al.

(10) Patent No.: US 8,748,912 B2
(45) Date of Patent: Jun. 10, 2014

(54) COMMON OPTICAL ELEMENT FOR AN ARRAY OF PHOSPHOR CONVERTED LIGHT EMITTING DEVICES

(75) Inventors: Michael D. Camras, Sunnyvale, CA (US); William R. Imler, Oakland, CA (US); Franklin J. Wall, Jr., Vacaville, CA (US); Frank M. Steranka, San Jose, CA (US); Michael R. Krames, Mountain View, CA (US); Helena Ticha, Srch (CZ); Ladislav Tichy, Srch (CZ); Robertus G. Alferink, Son (NL)

(73) Assignee: Philips Lumileds Lighting Company LLC, San Jose, CA (US)

( * ) Notice: Subject to any disclaimer, the term of this patent is extended or adjusted under 35 U.S.C. 154(b) by 0 days.

(21) Appl. No.: 13/288,291

(22) Filed: Nov. 3, 2011

(65) Prior Publication Data
US 2012/0043564 A1 Feb. 23, 2012

Related U.S. Application Data

(60) Continuation of application No. 12/686,209, filed on Jan. 12, 2010, now Pat. No. 8,067,254, which is a division of application No. 12/099,021, filed on Apr. 7, 2008, now abandoned, which is a division of application No. 10/987,241, filed on Nov. 12, 2004, now Pat. No. 7,419,839.

(51) Int. Cl.
*H01L 33/00* (2010.01)
(52) U.S. Cl.
USPC ............................ 257/88; 257/666; 438/27
(58) Field of Classification Search
USPC ................. 257/666, 88; 438/22, 27, 28, 30
See application file for complete search history.

(56) References Cited

U.S. PATENT DOCUMENTS

| | | | |
|---|---|---|---|
| 3,769,536 A | 10/1973 | Antypas et al. | |
| 4,391,683 A | 7/1983 | Buckley et al. | |

(Continued)

FOREIGN PATENT DOCUMENTS

| | | |
|---|---|---|
| DE | 19603444 C2 | 8/1997 |
| EP | 0926744 A2 | 6/1999 |

(Continued)

OTHER PUBLICATIONS

Chui et al, "High-efficiency AlGaInP Light-emitting Diodes", Semiconductor and Semimetals, vol. 64, Chapter 2, pp. 49-128, 1998.

(Continued)

*Primary Examiner* — Phuc Dang

(57) ABSTRACT

A device is provided with at least one light emitting device (LED) die mounted on a submount with an optical element subsequently thermally bonded to the LED die. The LED die is electrically coupled to the submount through contact bumps that have a higher temperature melting point than is used to thermally bond the optical element to the LED die. In one implementation, a single optical element is bonded to a plurality of LED dice that are mounted to the submount and the submount and the optical element have approximately the same coefficients of thermal expansion. Alternatively, a number of optical elements may be used. The optical element or LED die may be covered with a coating of wavelength converting material. In one implementation, the device is tested to determine the wavelengths produced and additional layers of the wavelength converting material are added until the desired wavelengths are produced.

18 Claims, 6 Drawing Sheets

(56) References Cited

U.S. PATENT DOCUMENTS

| | | |
|---|---|---|
| 4,675,058 A | 6/1987 | Plaster |
| 4,689,652 A | 8/1987 | Shimada et al. |
| 4,815,084 A | 3/1989 | Scifres et al. |
| 4,983,009 A | 1/1991 | Musk |
| 4,988,579 A | 1/1991 | Tomomura et al. |
| 5,040,868 A | 8/1991 | Waitl et al. |
| 5,055,892 A | 10/1991 | Gardner et al. |
| 5,130,531 A | 7/1992 | Ito et al. |
| 5,132,430 A | 7/1992 | Gaudiana et al. |
| 5,255,171 A | 10/1993 | Clark |
| 5,317,170 A | 5/1994 | Paoli |
| 5,376,580 A | 12/1994 | Kish et al. |
| 5,403,916 A | 4/1995 | Watanabe |
| 5,418,384 A | 5/1995 | Yamana et al. |
| 5,502,316 A | 3/1996 | Kish et al. |
| 5,528,057 A | 6/1996 | Yanagase et al. |
| 5,553,089 A | 9/1996 | Seki et al. |
| 5,661,316 A | 8/1997 | Kish et al. |
| 5,698,452 A | 12/1997 | Goossen |
| 5,724,376 A | 3/1998 | Kish, Jr. et al. |
| 5,779,924 A | 7/1998 | Krames et al. |
| 5,793,062 A | 8/1998 | Kish, Jr. et al. |
| 5,837,561 A | 11/1998 | Kish, Jr. et al. |
| 5,875,205 A | 2/1999 | Spaeth et al. |
| 5,898,185 A | 4/1999 | Bojarczuk, Jr. et al. |
| 5,917,201 A | 6/1999 | Ming-Jiunn et al. |
| 5,925,898 A | 7/1999 | Spath |
| 5,966,399 A | 10/1999 | Jiang et al. |
| 6,015,719 A | 1/2000 | Kish, Jr. et al. |
| 6,075,627 A | 6/2000 | Feldman et al. |
| 6,091,020 A | 7/2000 | Fairbanks et al. |
| 6,091,694 A | 7/2000 | Spath |
| 6,155,699 A | 12/2000 | Miller et al. |
| 6,165,911 A | 12/2000 | Calveley |
| 6,214,733 B1 | 4/2001 | Sickmiller |
| 6,233,267 B1 | 5/2001 | Nurmikko et al. |
| 6,395,564 B1 | 5/2002 | Huang |
| 6,412,971 B1 | 7/2002 | Wojnarowski et al. |
| 6,429,462 B1 | 8/2002 | Shveykin |
| 6,469,785 B1 | 10/2002 | Duveneck et al. |
| 6,473,554 B1 | 10/2002 | Pelka et al. |
| 6,483,196 B1 | 11/2002 | Wojnarowski et al. |
| 6,495,862 B1 | 12/2002 | Okazaki et al. |
| 6,576,488 B2 * | 6/2003 | Collins et al. .................. 438/29 |
| 6,598,998 B2 | 7/2003 | West et al. |
| 6,730,940 B1 | 5/2004 | Steranka |
| 6,793,339 B1 * | 9/2004 | Yip et al. ................. 351/159.62 |
| 6,950,243 B2 * | 9/2005 | Wiese et al. .................. 359/689 |
| 6,969,946 B2 | 11/2005 | Steranka |
| 6,987,613 B2 | 1/2006 | Pocius et al. |
| 7,005,679 B2 | 2/2006 | Tarsa et al. |
| 7,009,213 B2 | 3/2006 | Camras et al. |
| 7,015,514 B2 | 3/2006 | Baur |
| 7,053,419 B1 | 5/2006 | Camras et al. |
| 7,157,746 B2 | 1/2007 | Ota et al. |
| 7,205,575 B2 * | 4/2007 | Chin et al. ...................... 257/88 |
| 7,232,224 B2 | 6/2007 | Penn |
| 7,252,787 B2 | 8/2007 | Hancu et al. |
| 7,258,816 B2 | 8/2007 | Tamaki et al. |
| 7,358,929 B2 | 4/2008 | Mueller et al. |
| 7,471,040 B2 | 12/2008 | Nishimura |
| 2002/0030194 A1 * | 3/2002 | Camras et al. .................. 257/98 |
| 2002/0093023 A1 * | 7/2002 | Camras et al. .................. 257/94 |
| 2002/0141006 A1 | 10/2002 | Pocius et al. |
| 2002/0171911 A1 | 11/2002 | Maegawa |
| 2003/0089918 A1 | 5/2003 | Hiller et al. |
| 2003/0127176 A1 * | 7/2003 | Yoshikawa et al. ............. 156/99 |
| 2003/0179667 A1 * | 9/2003 | Yoshinaka et al. ......... 369/44.41 |
| 2003/0227249 A1 | 12/2003 | Mueller et al. |
| 2004/0051106 A1 | 3/2004 | Baur et al. |
| 2004/0061107 A1 | 4/2004 | Duggal |
| 2004/0135166 A1 * | 7/2004 | Yamada et al. ................ 257/103 |
| 2004/0160772 A1 | 8/2004 | Tatsukawa |
| 2004/0160783 A1 | 8/2004 | Tatsukawa |
| 2004/0183081 A1 | 9/2004 | Shishov et al. |
| 2004/0188696 A1 * | 9/2004 | Hsing et al. ..................... 257/99 |
| 2004/0206970 A1 * | 10/2004 | Martin ............................ 257/98 |
| 2004/0218387 A1 | 11/2004 | Gerlach |
| 2004/0223315 A1 | 11/2004 | Suehiro et al. |
| 2005/0001225 A1 | 1/2005 | Yoshimura et al. |
| 2005/0023540 A1 | 2/2005 | Yoko et al. |
| 2005/0023545 A1 | 2/2005 | Camras et al. |
| 2005/0032257 A1 | 2/2005 | Camras et al. |
| 2005/0093007 A1 * | 5/2005 | Steigerwald et al. ........... 257/89 |
| 2005/0127375 A1 | 6/2005 | Erchak et al. |
| 2005/0230689 A1 | 10/2005 | Setlur et al. |
| 2005/0231105 A1 | 10/2005 | Lovell et al. |
| 2005/0247944 A1 | 11/2005 | Haque et al. |
| 2005/0266614 A1 * | 12/2005 | Aoyagi ......................... 438/109 |
| 2005/0269582 A1 | 12/2005 | Mueller et al. |
| 2005/0274967 A1 | 12/2005 | Martin et al. |
| 2006/0012299 A1 * | 1/2006 | Suehiro et al. ................ 313/512 |
| 2006/0033423 A1 | 2/2006 | Nishimura |
| 2006/0045832 A1 | 3/2006 | Nagatomi et al. |
| 2006/0066210 A1 | 3/2006 | Ng et al. |
| 2006/0078031 A1 * | 4/2006 | Govorkov et al. ............... 372/69 |
| 2006/0091784 A1 * | 5/2006 | Conner et al. ................. 313/498 |
| 2006/0105478 A1 | 5/2006 | Camras et al. |
| 2006/0175625 A1 | 8/2006 | Yokotani |
| 2011/0070669 A1 | 3/2011 | Hiller |
| 2012/0171789 A1 | 7/2012 | Suehiro |

FOREIGN PATENT DOCUMENTS

| | | |
|---|---|---|
| FR | 1419663 | 11/1965 |
| JP | 09153645 | 6/1997 |
| JP | 09167515 A | 6/1997 |
| JP | 2000114603 | 4/2000 |
| JP | 2002-344029 | 11/2002 |
| JP | 2003101074 | 4/2003 |
| WO | 0069000 | 11/2000 |
| WO | 0070687 | 11/2000 |
| WO | 0141219 | 6/2001 |
| WO | 0141225 | 6/2001 |
| WO | 0180322 | 10/2001 |
| WO | 0237578 | 5/2002 |
| WO | 03007663 | 1/2003 |
| WO | 03038902 | 5/2003 |
| WO | 2004082036 A1 | 9/2004 |

OTHER PUBLICATIONS

Babic et al, "Room-temperature Continuous-wave Operation of 1.54-μm Vertical-cavity Lasers", IEEE Photonics Technology Letters, vol. 7, No. 11, Nov. 1995, pp. 1225-1227.

Chua et al, "Dielectrically-bonded Long Wavelength Vertical Cavity Laser on GaAs Substrates Using Strain-compensated Multiple Quantum Wells", IEEE Photonics Technology Letters, vol. 6, No. 12, Dec. 1994—pp. 1400-1402.

Fisher et al, "Highly Refractive Glasses to Improve Elecroluminescent Diode Efficiencies", Journal of the Electrochemical Society: Solid State Science, Dec. 1969, pp. 1718-1722.

Carr, "Photometric Figures of Merit for Semiconductor Luminescent Sources Operating in Spontaneous Mode", Infrared Physics, 1966, vol. 6, pp. 1-19.

Mary T. Strzelecki et al, "Low Temperature Bonding of Glasses and Glass Ceramics", 8 pages, 2002.

Robert D. Simpson et al, "Hybrid Glass Structures for Telecommunication Applications", 8 pages, 1996.

Joseph S, Hayden, Passive and Active Characterization of Hybrid Glass Substrates for Telecommunication Applications, 8 pages, 1994.

J.W. Osenbach et al, "Low Cost/High Volume Laser Modules Using Silicon Optical Bench Technology", 1998 Electronic Components and Technology conference, p. 581.

Aluminum Oxide, Al2O3 for Optical Coating, CERAC, Inc. Technical Publications, pp. 1-4 , 2006.

"Bulk Measurement", Sairon Technology, Inc. pp. 103, 2004.

(56) References Cited

OTHER PUBLICATIONS

Thomas R. Anthony, "Dielectric Isolation of Silicon by Anodic Bonding", J. Appl. Phys., vol. 58, No. 3, Aug. 1, 1985, pp. 1240-1247.
Joshua Israelsohn, "Switching the Light Fantastic", Techtrends, EDN, Oct. 26, 2000, 10 pages.
Boris A. Matveev et al, "III-V Optically Pumped Mid-IR LEDs", Light-Emitting Diodes: Research Manufacturing and Applications, V.H. Walter Yao, E. Fred Schubert Editors, Proceedings of SPIE, vol. 4278 (2001), pp. 189-196.

* cited by examiner

COMMON OPTICAL ELEMENT FOR AN ARRAY OF PHOSPHOR CONVERTED LIGHT EMITTING DEVICES

The present application is a continuation of U.S. application Ser. No. 12/686,209 filed on Jan. 12, 2010, now U.S. Pat. No. 8,067,254, entitled "Common Optical Element for an array of Phosphor Converted Light Emitting Devices" which is a divisional application of and claims priority to U.S. patent application Ser. No. 12/099,021, filed Apr. 7, 2008, now abandoned, entitled "Array of Light Emitting Devices to Produce a White Light Source," by Michael D. Camras et al. which is a divisional application of and claims priority to U.S. patent application Ser. No. 10/987,241, filed Nov. 12, 2004, now U.S. Pat. No. 7,419,839, entitled "Bonding an Optical Element to a Light Emitting Device", by Michael D. Camras et al. which are all incorporated herein by reference.

FIELD OF THE INVENTION

The present invention relates generally to light emitting devices and, more particularly, to bonding an optical element to one or more light emitting device dice.

BACKGROUND

Semiconductor light emitting devices (LEDs) are typically covered with an optical element to protect the semiconductor structures, increase light extraction efficiency, and assist in focusing the emitted light. One type of material used to encapsulate LEDs is epoxy. Epoxy, however, is a low refractive index material and thus is not as effective as a higher index material at reducing losses due to total internal reflection at the semiconductor/low index encapsulant interface. Further, epoxy and other organic encapsulants typically suffer from yellowing when used with LEDs that operate with high temperature and/or short wavelengths. Moreover, epoxy encapsulants typically have coefficients of thermal expansion that poorly match those of the semiconductor materials in the LED. Consequently, the epoxy encapsulant subjects the LED to mechanical stress upon heating or cooling and may damage the LED.

Thus, an improved optical element with increased light extraction efficiency and is resistant to yellowing or other degradation and a method of bonding such an optical element to an LED is desirable.

SUMMARY

In accordance with one embodiment of the present invention, a device is produced by mounting at least one light emitting device (LED) die on a submount and subsequently bonding an optical element to the LED die. The LED die is electrically coupled to the submount through contact elements, such as solder bumps or pads, that have a higher temperature melting point than is used to bond the optical element to the LED die. In one implementation, a single optical element is bonded to a plurality of LED dice that are mounted to the submount and the submount and the optical element have approximately the same coefficients of thermal expansion. Alternatively, a number of optical elements may be used. The LED or the optical element may be covered with a coating of wavelength converting material. In one implementation, the device is tested to determine the wavelengths produced and the thickness of the wavelength converting material is altered, i.e., increased or possibly decreased, until the desired wavelengths are produced.

DETAILED DESCRIPTION

Figure 1A:
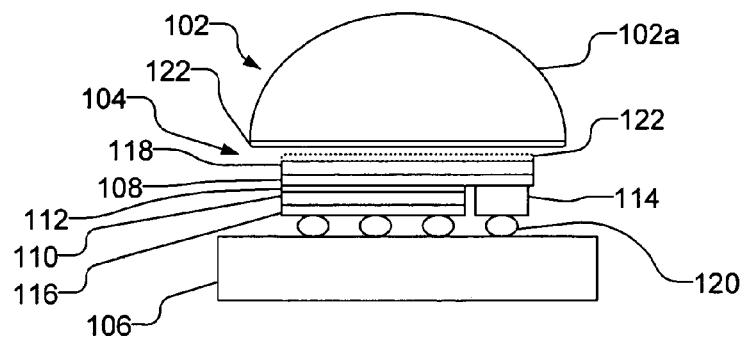
FIG. 1A illustrates a side view of an LED die mounted on a submount and an optical element that is to be bonded to the LED die.
Figure 1B:
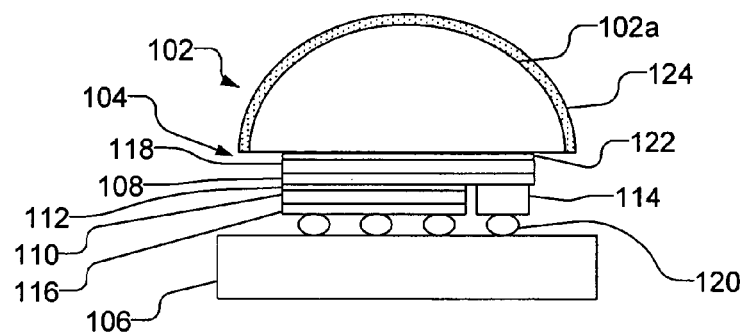
FIG. 1B illustrates the optical element bonded to the LED die.

FIG. 1A illustrates a side view of a transparent optical element 102 and a light emitting diode (LED) die 104 that is mounted on a submount 106. The optical element 102 is to be bonded to the LED die 104 in accordance with an embodiment of the present invention. FIG. 1B illustrates the optical element 102 bonded to the LED die 104.

The term "transparent" is used herein to indicate that the element so described, such as a "transparent optical element," transmits light at the emission wavelengths of the LED with less than about 50%, preferably less than about 10%, single pass loss due to absorption or scattering. The emission wavelengths of the LED may lie in the infrared, visible, or ultraviolet regions of the electromagnetic spectrum. One of ordinary skill in the art will recognize that the conditions "less than 50% single pass loss" and "less than 10% single pass loss" may be met by various combinations of transmission path length and absorption constant.

LED die 104 illustrated in FIGS. 1A and 1B includes a first semiconductor layer 108 of n-type conductivity (n-layer) and a second semiconductor layer 110 of p-type conductivity (p-layer). Semiconductor layers 108 and 110 are electrically coupled to an active region 112. Active region 112 is, for example, a p-n diode junction associated with the interface of layers 108 and 110. Alternatively, active region 112 includes one or more semiconductor layers that are doped n-type or p-type or are undoped. LED die 104 includes an n-contact 114 and a p-contact 116 that are electrically coupled to semiconductor layers 108 and 110, respectively. Contact 114 and contact 116 are disposed on the same side of LED die 104 in a "flip chip" arrangement. A transparent superstrate 118 coupled to the n layer 108 is formed from a material such as, for example, sapphire, SiC, GaN, GaP, diamond, cubic zirconia (ZrO2), aluminum oxynitride (AlON), AlN, spinel, ZnS, oxide of tellurium, oxide of lead, oxide of tungsten, polycrystalline alumina oxide (transparent alumina), and ZnO.

Active region 112 emits light upon application of a suitable voltage across contacts 114 and 116. In alternative implementations, the conductivity types of layers 108 and 110, together with respective contacts 114 and 116, are reversed. That is, layer 108 is a p-type layer, contact 114 is a p-contact, layer 110 is an n-type layer, and contact 116 is an n-contact.

Semiconductor layers 108 and 110 and active region 112 may be formed from III-V semiconductors including but not limited to AlN, AlP, AlAs, AlSb, GaN, GaP, GaAs, GaSb, InN, InP, InAs, InSb, II-VI semiconductors including but not limited to ZnS, ZnSe, CdSe, ZnO, CdTe, group IV semiconductors including but not limited to Ge, Si, SiC, and mixtures or alloys thereof.

Contacts 114 and 116 are, in one implementation, metal contacts formed from metals including but not limited to gold, silver, nickel, aluminum, titanium, chromium, platinum, palladium, rhodium, rhenium, ruthenium, tungsten, and mixtures or alloys thereof.

Although FIGS. 1A and 1B illustrate a particular structure of LED die 104, the present invention is independent of the structure of the LED die. Accordingly, other types of LED configurations may be used instead of the specific configuration shown. Further, the number of semiconductor layers in LED die 104 and the detailed structure of active region 112 may differ. It should be noted that dimensions of the various elements of LED die 104 illustrated in the various figures are not to scale.

The LED die 104 is mounted to submount 106 via contacts elements 120, such as solder bumps, pads, or other appropriate elements, such as a layer of solder. Contact elements 120 will be sometimes referred to herein as bumps 120 for the sake of simplicity. Bumps 120 are manufactured from Au, Sn, Ag, Sb, Cu, Pb, Bi, Cd, In, Zn or alloys thereof including AuSn, SnSb, SnCu, SnAg, SnAgBi, InSn, BiPbSn, BiPbCd, BiPbIn, InCd, BiPb, BiSn, InAg, BiCd, InBi, InGa, or other appropriate material with a melting temperature that is greater than the temperature that will be used to bond the optical element 102 to the LED die 104, but is preferably Au or AuSn. In one implementation, the melting temperature of bumps 120 is greater than 250° C. and preferably greater than 300° C. The submount 106 may be, e.g., silicon, alumina or AlN and may include vias for backside connections.

The LED die 104 is mounted to the submount 106, e.g., using thermosonic bonding. For example, during the thermosonic bonding process, the LED die 104 with bumps 120 are aligned with the submount 106 in the desired position while the submount 106 is heated to approximately 150-160° C. A bond force of, e.g., approximately 50-100 gm/bump, is applied to the LED die 104 by a bonding tool, while ultrasonic vibration is applied. If desired other processes may be used, such as thermo-compression, to bond the LED die 104 to the submount 106. As is well known in the art, with thermo-compression higher temperatures and greater bonding forces are typically required.

In some embodiments, an underfill may be used with the LED die 104 and submount 106. The underfill material may have good thermal conductivity and have a coefficient of thermal expansion that approximately matches the LED die 104 and the submount 106. In another embodiment, a protective side coat, e.g., of silicone or other appropriate material, may be applied to the sides of the LED die 104 and the submount 106. The protective side coating acts as a sealant and limits exposure of the LED 104 and the bumps 120 to contamination and the environment.

For more information regarding producing bumps 120 from Au or Au/Sn and for submounts with backside vias and bonding LED dice with Au or Au/Sn bumps to a submount, see U.S. Ser. No. 10/840,459, by Ashim S. Hague, filed May 5, 2004, which has the same assignee as the present disclosure and is incorporated herein by reference. It should be understood, however, that the present invention is not limited to any specific type of submount and that any desired submount configuration may be used if desired.

After the LED die 104 is mounted to the submount 106, the optical element 102 is thermally bonded to the LED die 104. In one embodiment, a layer of bonding material is applied to the bottom surface of the optical element 102 to form transparent bonding layer 122 that is used to bond optical element 102 to LED die 104. In some embodiments, the transparent bonding layer 122 may be applied to the top surface of the LED die 104, e.g., to superstrate 118, (as indicated by the dotted lines 122 in FIG. 1A). The bonding layer 122 can be applied to the LED die 104 prior to or after mounting the LED die 104 to the submount 106. Alternatively, no bonding layer may be used and the optical element 102 may be bonded directly to the LED die 104, e.g., the superstrate 118. The transparent bonding layer 122 is, for example, about 10 Angstroms (Å) to about 100 microns (μm) thick, and is preferably about 1000 Å to about 10 μm thick, and more specifically, about 0.5 μm to about 5 μm thick. The bonding material is applied, for example, by conventional deposition techniques including but not limited to spinning, spraying, sputtering, evaporation, chemical vapor deposition (CVD), or material growth by, for example, metal-organic chemical vapor deposition (MOCVD), vapor phase epitaxy (VPE), liquid phase epitaxy (LPE), or molecular beam epitaxy (MBE). In one embodiment, the optical element 102 may be covered with a wavelength converting material 124, which will be discussed in more detail below.

In one implementation, the bonding material from which transparent bonding layer 122 is formed from glass such as SF59, LaSF 3, LaSF N18, SLAH51, LAF10, NZK7, NLAF21, LASFN35, SLAM60, or mixtures thereof, which are available from manufactures such as Schott Glass Technologies Incorporated, of Duryea, Pa. and Ohara Corporation in Somerville, N.J. Bonding layer 122 may also be formed from a high index glass, such as (Ge, As, Sb, Ga) (S, Se, Te, Cl, Br) chalcogenide or chalcogen-halogenide glasses, for example.

In other implementations, bonding layer 122 may be formed from III-V semiconductors including but not limited to GaP, InGaP, GaAs, and GaN; II-VI semiconductors including but not limited to ZnS, ZnSe, ZnTe, CdS, CdSe, and CdTe; group IV semiconductors and compounds including but not limited to Si, and Ge; organic semiconductors, metal oxides including but not limited to oxides of antimony, bismuth, boron, copper, niobium, tungsten, titanium, nickel, lead, tellurium, phosphor, potassium, sodium, lithium, zinc, zirconium, indium tin, or chromium; metal fluorides including but not limited to magnesium fluoride, calcium fluoride, potassium fluoride, sodium fluoride, and zinc fluoride; metals including but not limited to Zn, In, Mg, and Sn; yttrium aluminum garnet (YAG), phosphide compounds, arsenide compounds, antimonide compounds, nitride compounds, high index organic compounds; and mixtures or alloys thereof.

In implementations where the LED die 104 is configured with the n-contact and p-contact on opposite sides of the die 104, the transparent bonding layer 122 or 122' may be patterned with, for example, conventional photolithographic and etching techniques to leave the top contact uncovered by bonding material and thus to permit contact to make electrical contact with a metallization layer on the optical element 102, which may serve as a lead, as is described in U.S. Ser. No. 09/880,204, filed Jun. 12, 2001, by Michael D. Camras et al., entitled "Light Emitting Diodes with Improved Light Extraction Efficiency" having Pub. No. 2002/0030194, which is incorporated herein by reference.

In one implementation, the optical element 102 is formed from optical glass, high index glass, GaP, CZ, ZnS, SiC, sapphire, diamond, cubic zirconia (ZrO2), AlON, by Sienna Technologies, Inc., polycrystalline aluminum oxide (transparent alumina), spinel, Schott glass LaFN21, Schott glass LaSFN35, LaF2, LaF3, and LaF10 available from Optimax Systems Inc. of Ontario, N.Y., an oxide of Pb, Te, Zn, Ga, Sb, Cu, Ca, P, La, Nb, or W, or any of the materials listed above for use as bonding materials in transparent bonding layer 122, excluding thick layers of the metals.

The transparent optical element 102 may have a shape and a size such that light entering optical element 102 from LED die 104 will intersect surface 102a of optical element 102 at angles of incidence near normal incidence. Total internal reflection at the interface of surface 102a and the ambient medium, typically air, is thereby reduced. In addition, since the range of angles of incidence is narrow, Fresnel reflection losses at surface 102a can be reduced by applying a conventional antireflection coating to the surface 102a. The shape of optical element 102 is, for example, a portion of a sphere such as a hemisphere, a Weierstrass sphere (truncated sphere), or a portion of a sphere less than a hemisphere. Alternatively, the shape of optical element 102 is a portion of an ellipsoid such as a truncated ellipsoid. The angles of incidence at surface 102a for light entering optical element 102 from LED die 4 more closely approach normal incidence as the size of optical element 102 is increased. Accordingly, the smallest ratio of a length of the base of transparent optical element 102 to a length of the surface of LED die 104 is preferably greater than about 1, more preferably greater than about 2.

After the LED die 104 is mounted on the submount 106, the optical element 102 is thermally bonded to the LED die 104. For example, to bond the optical element 102 to the LED die 104, the temperature of bonding layer 122 is raised to a temperature between about room temperature and the melting temperature of the contact bumps 120, e.g., between approximately 150° C. to 450° C., and more particularly between about 200° C. and 400° C., and optical element 102 and LED die 104 are pressed together at the bonding temperature for a period of time of about one second to about 6 hours, preferably for about 30 seconds to about 30 minutes, at a pressure of about 1 pound per square inch (psi) to about 6000 psi. By way of example, a pressure of about 700 psi to about 3000 psi may be applied for between about 3 to 15 minutes.

The thermal bonding of the optical element 102 to the LED die 104 requires the application of elevated temperatures. With the use of bumps 120 that have a high melting point, i.e., higher than the elevated temperature used in the thermal bonding process, the LED die 104 may be mounted to the submount 106 before the optical element 102 is bonded to the LED die 104 without damaging the LED die/submount connection. Mounting the LED die 104 to the submount 106 prior to bonding the optical element 102 simplifies the pick and place process.

Bonding an optical element 102 to an LED die 104 is described in US Pub. No. 2002/0030194; Ser. No. 10/633,054, filed Jul. 31, 2003, by Michael D. Camras et al., entitled "Light Emitting Devices with Improved Light Extraction Efficiency"; Ser. No. 09/660,317, filed Sep. 12, 2000, by Michael D. Camras et al., entitled "Light Emitting Diodes with Improved Light Extraction Efficiency; Ser. No. 09/823,841, filed Mar. 30, 2001, by Douglas Pocius, entitled "Forming an Optical Element on the Surface of a Light Emitting Device for Improved Light Extraction" having Pub. No. 2002/0141006, which have the same assignee as the present application and which are incorporated herein by reference. Further, the process of bonding optical element 102 to LED die 104 described above may be performed with devices disclosed in U.S. Pat. Nos. 5,502,316 and 5,376,580, incorporated herein by reference, previously used to bond semiconductor wafers to each other at elevated temperatures and pressures. The disclosed devices may be modified to accommodate LED dice and optical elements, as necessary. Alternatively, the bonding process described above may be performed with a conventional vertical press.

It should be noted that due to the thermal bonding process, a mismatch between the coefficient of thermal expansion (CTE) of optical element 102 and LED die 104 can cause optical element 102 to detach from LED die 104 upon heating or cooling. Accordingly, optical element 102 should be formed from a material having a CTE that approximately matches the CTE of LED die 104. Approximately matching the CTEs additionally reduces the stress induced in the LED die 104 by bonding layer 122 and optical element 102. With suitable CTE matching, thermal expansion does not limit the size of the LED die that may be bonded to the optical element and, thus, the optical element 102 may be bonded to a large LED die 104, e.g., up to 16 mm$^2$ or larger.

Figure 2:
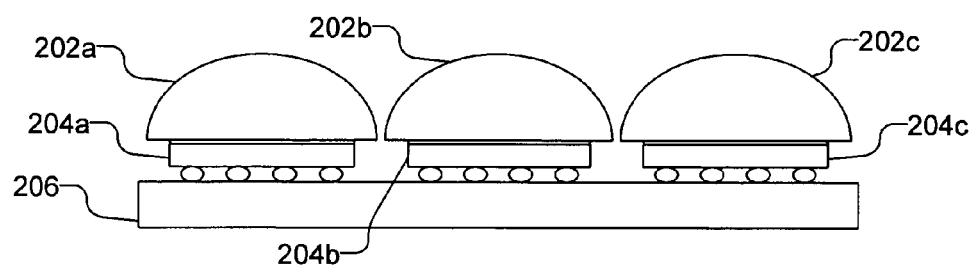
FIG. 2 illustrates an embodiment in which multiple LED dice are mounted to a submount and a separate optical element is bonded to each LED die.

FIG. 2 illustrates an embodiment in which multiple LED dice 204a, 204b, and 204c (sometimes collectively referred to as LED dice 204) are mounted on a submount 206. The LED dice 204 are schematically illustrated in FIG. 2 without showing the specific semiconductor layers. Nevertheless, it should be understood that the LED dice 204 may be similar to LED die 104 discussed above.

The LED dice 204 are each mounted to submount 206 as described above. Once the LED dice 204 are mounted on submount 206, individual optical elements 202a, 202b, and 202c are bonded to LED dice 204a, 204b, and 204c, respectively, in a manner such as that described above.

If desired, the LED dice 204 may be the same type of LED and may produce the same wavelengths of light. In another implementation, one or more of the LED dice 204 may produce different wavelengths of light, which when combined may be used to produce light with a desired correlated color temperature (CCT), e.g., white light. Another optical element (not shown in FIG. 2) may be used to cover optical elements 202a, 202b, and 202c and aid in mixing the light.

Figure 3:
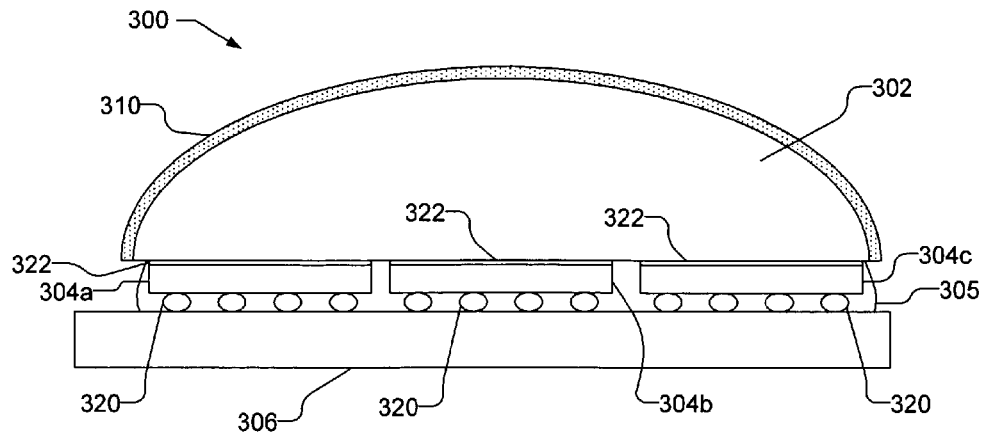
FIG. 3 illustrates an embodiment in which multiple LED dice are mounted to a submount and a single optical element is bonded to the LED dice.

FIG. 3 illustrates an embodiment of an LED device 300 that includes multiple LED dice 304a, 304b, and 304c (sometimes collectively referred to as LED dice 304) mounted on a submount 306 and a single optical element 302 bonded to the LED dice 304. The LED dice 304 may be similar to LED die 104 discussed above.

The use of a single optical element 302 with multiple LED dice 304, as shown in FIG. 3, is advantageous as the LED dice 304 can be mounted close together on submount 306. Optical components typically have a larger footprint than an LED die to which it is bonded, and thus, the placement of LED dice with separate optical elements is constrained by the size of the optical elements.

After the LED dice 304 are mounted to the submount, there may be slight height variations in the top surfaces of the LED dice 304, e.g., due to the differences in the height of the bumps 320 and thickness of the dice. When the single optical element 302 is thermally bonded to the LED dice 304, any differences in the height of the LED dice 304 may be accommodated by the compliance of the bumps 320.

During the thermal bonding process of the optical element 302 to the LED dice 304, the LED dice 304 may shift laterally due to the heating and cooling of the submount 306. With the use of some bumps 320, such as Au, the compliance of the bumps 320 can be inadequate to accommodate lateral shift of the LED dice 304. Accordingly, the coefficient of thermal expansion of the optical element 302 ($CTE_{302}$) should approximately match the coefficient of thermal expansion of the submount 306 ($CTE_{306}$). With an approximate match between $CTE_{302}$ and $CTE_{306}$ any movement of the LED dice 304 caused by the expansion and contraction of the submount 306 will be approximately matched by the expansion and contraction of the optical element 302. A mismatch between $CTE_{302}$ and $CTE_{306}$, on the other hand, can result in the detachment of the LED dice 304 from the optical element 302 or other damage to the LED device 300, during the heating and cooling of the thermal bonding process.

With the use of sufficiently small LED dice 304, the thermal expansion of the LED dice 304 themselves during the thermal bonding process may be minimized. With the use of large LED dice 304, however, the amount of thermal expansion of the LED dice 304 during the thermal bonding process may be large and thus, the CTE for the LED dice 304 also should be appropriately matched to the CTE of the submount 306.

The LED dice 304 may be, e.g., InGaN, AlInGaP, or a combination of InGaN and AlInGaP devices. In one implementation, the submount 302 may be manufactured from AlN, while the optical element 302 may be manufactured from, e.g., SLAM60 by Ohara Corporation, or NZK7 available from Schott Glass Technologies Incorporated. In another implementation, an Alumina submount 306 may be used along with an optical element 302 manufactured from sapphire, Ohara Glass SLAH51 or Schott glass NLAF21. In some implementations, a bulk filler 305 between the LED dice 304 and the submount 306 may be used. The bulk filler 305 may be, e.g., silicone or glass. The bulk filler 305 may have good thermal conductivity and may approximately match the CTE of the submount 306 and the dice 304. If desired, a protective side coating may be applied alternatively or in addition to the bulk filler 305.

In one implementation, all of the LED dice 304 may be the same type and produce different or approximately the same wavelengths of light. Alternatively, with an appropriate choice of LED dice 304 and/or wavelength conversion materials, different wavelengths of light may be produced, e.g., blue, green and red. When LED dice 304 are the same type, the CTE for the LED dice 304 will be approximately the same. It may be desirable for the CTE of the LED dice 304 to closely match the coefficient of thermal expansion of the optical element 302 and the submount 306 to minimize the risk of detachment or damage to the LED dice 304 during the thermal bonding process.

In another implementation, the LED dice 304 may be different types and produce different wavelengths of light. With the use of different types of LED dice, the CTE of the dice can vary making it difficult to match the CTE for all the LED dice 304 with that of the optical element 302 and the submount 306. Nevertheless, with a judicious choice of the optical element 302 and submount 306 with CTEs that are as close as possible to that of the LED dice 304, problems associated with detachment of the LED dice 304 or other damage to the device 300 during the thermal bonding process may be minimized. Additionally, with the use of relatively small LED dice 304, e.g., the area smaller than approximately 1 mm², problems associated with thermal bonding a single optical element 302 to multiple dice 304 may also be reduced. The use of a bulk filler 305 may also prevent damage to the device during thermal processing or operation.

Figure 4:
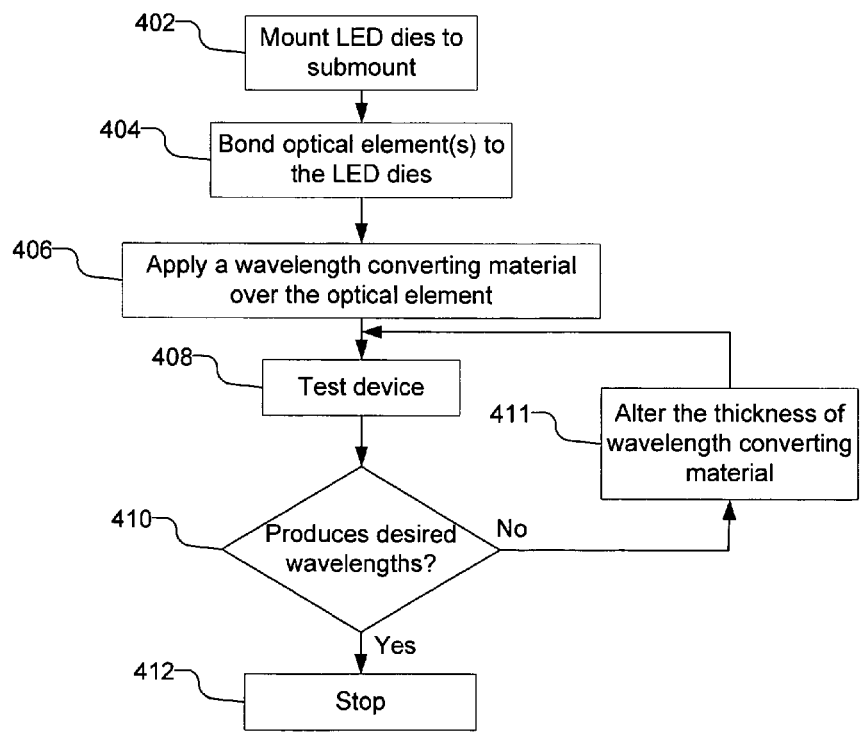
FIG. 4 is a flow chart of one implementation of producing such an LED device with wavelength converting material covering the optical element.

As shown in FIG. 3, in one implementation, the optical element 302 may be coated with a wavelength converting material 310, such as a phosphor coating. In one embodiment, the wavelength converting material 310 is YAG. FIG. 4 is a flow chart of one implementation of producing such a device. As illustrated in FIG. 4, the LED dice 304 are mounted to the submount 306 (step 402) and the optical element 302 is bonded to the LED dice 304 (step 404). After the optical element 302 is bonded to the LED dice 304, a layer of the wavelength converting material 310 is deposited over the optical element 302 (step 406). The device can then be tested, e.g., by applying a voltage across the active regions of the LED dice 304 and detecting the wavelengths of light produced by the device (step 408). If the device does not produce the desired wavelengths (step 410), the thickness of the wavelength converting material is altered (step 411), e.g., by depositing additional wavelength converting material 310 over the optical element 302 or by removing some of the wavelength converting material by etching or dissolution and the device is again tested (step 408). The process stops once the desired wavelengths of light are produced (step 412).

Thus, the thickness of the wavelength converting material 310 coating is controlled in response to the light produced by the LED dice 304 resulting in a highly reproducible correlated color temperature. Moreover, because the deposition of the wavelength converting material 310 is in response to the specific wavelengths produced by the LED dice 304, a variation in the wavelengths of light produced by LED dice 304 can be accommodated. Accordingly, fewer LED dice 304 will be rejected for producing light with wavelengths outside a useful range of wavelengths.

It should be understood that the process of coating the optical element with a wavelength converting material may be applied to the embodiments shown in FIGS. 1B and 2 as well.

Figure 5:
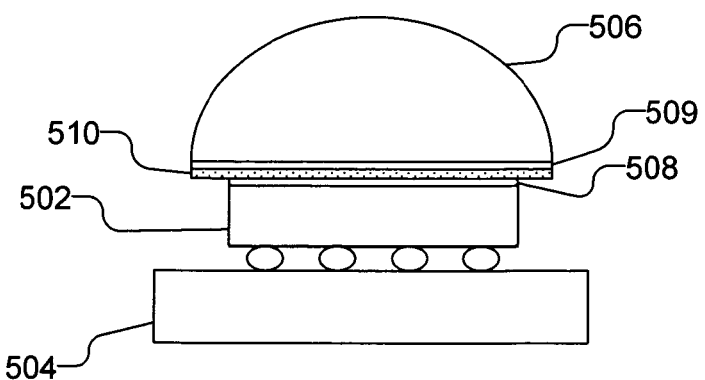
FIG. 5 illustrates an embodiment in which a layer of wavelength converting material is disposed between the bonding layer and the optical element.

In another implementation, the coating of wavelength converting material may be placed between the LED die and the optical element, e.g., within, over, or under the bonding layer 322. FIG. 5, by way of example, illustrates an LED die 502 mounted to a submount 504 and bonded to an optical element 506 via bonding layer 508, where a layer of wavelength converting material 510 is disposed between the bonding layer 508 and the optical element 506. The wavelength converting material 510 may be bonded to the bottom surface of the optical element 506 by bonding layer 509 prior to or during the bonding the optical element 506 to the LED die 502. The wavelength converting material 510 may be, e.g., a phosphor impregnated glass or wavelength converting ceramic that is formed independently and then bonded to the LED die 502 and optical element 506. In some embodiments, the wavelength converting material 510 may be bonded directly to one or both of the LED die 502 and optical element 506. In one embodiment, the optical element 506, LED die 502 and wavelength converting material 510 may be bonded together simultaneously. In another embodiment, the wavelength converting material 510 may be bonded first to the optical element 506 and subsequently bonded to the LED die 502, e.g., where the bonding layer 509 has a higher bonding temperature than the bonding layer 508. A suitable wavelength converting material, such as a phosphor impregnated glass, is discussed in more detail in U.S. Ser. No. 10/863,980, filed on Jun. 9, 2004, by Paul S. Martin et al., entitled "Semiconductor Light Emitting Device with Pre-Fabricated Wavelength Converting Element", which has the same assignee as the present application and is incorporated herein by reference.

Figure 6:
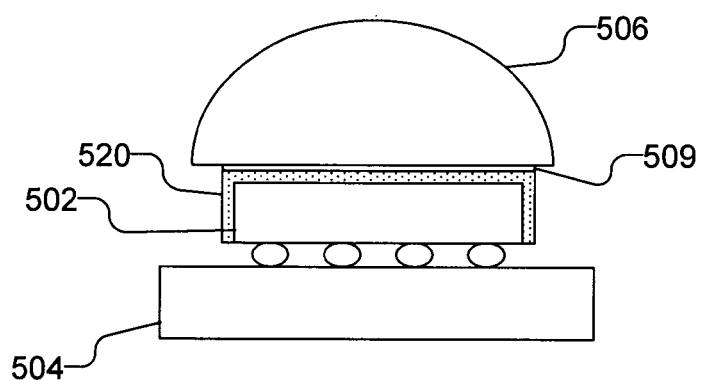
FIG. 6 illustrates an embodiment in which a layer of wavelength converting material is deposited on the LED die.

FIG. 6 illustrates another embodiment, similar to the embodiment shown in FIG. 5, except a wavelength converting material 520 is bonded directly to the LED die 502 (and optionally over the edges of the LED die 502) prior to or during bonding of the optical element 506. Thus, as shown in FIG. 6, the wavelength converting material 520 is placed between the LED die 502 and the bonding layer 509. If desired, an additional layer of wavelength converting material may be deposited over the optical element 506 in FIGS. 5 and 6, as discussed above.

In another implementation, the coating of wavelength converting material may be located over the LED die or dice remotely, e.g., on an envelope of glass, plastic, epoxy, or silicone with a hollow space between the envelope and the LED die or dice. If desired, the hollow space may be filled with a material such as silicone or epoxy.

Figure 7:
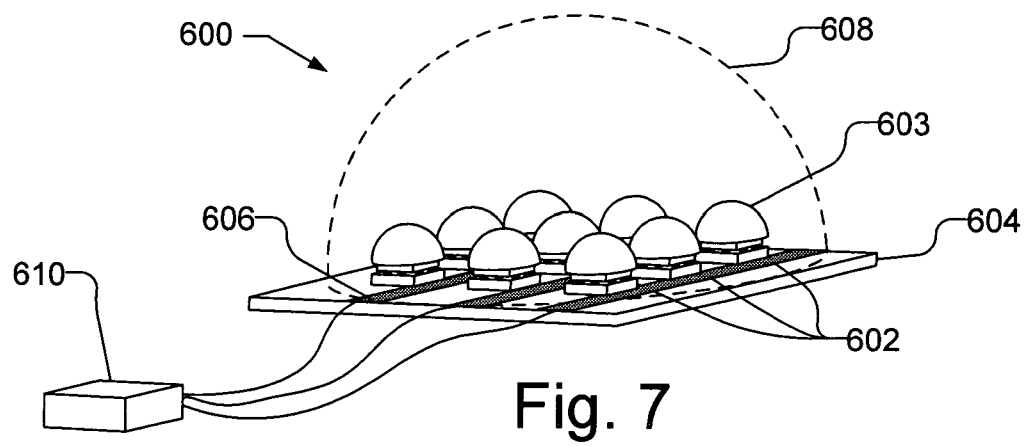
FIG. 7 illustrates an array of LEDs, which are mounted on a board.

FIG. 7 illustrates an array 600 of LEDs 602, which are mounted on a board 604. The board 604 includes electrical traces 606 that are used to provide electrical contact to the LEDs 602. The LEDs 602 may be phosphor converted devices manufactured, e.g., as described above. The LEDs 602 may each produce white light with different CCTs. By mixing the white light with different CCTs in array 600, a light with a desired CCT may be produced. If desired, the LEDs 602 may be covered with a transparent element 608 of e.g., glass, plastic, epoxy, or silicone. The transparent element 608 may be filled, e.g., with epoxy or silicone, which assists the extracting and mixing of the light and to protect the LEDs 602. It should be understood that array 600 may include any number of LEDs 602 and that if desired, one or more of the LEDs may produce non-white light. Moreover, if desired, a plurality of the LEDs 602 may be bonded to a single optical element 603, or one or more of the LEDs 602 may not include optical element 603.

Figure 8:
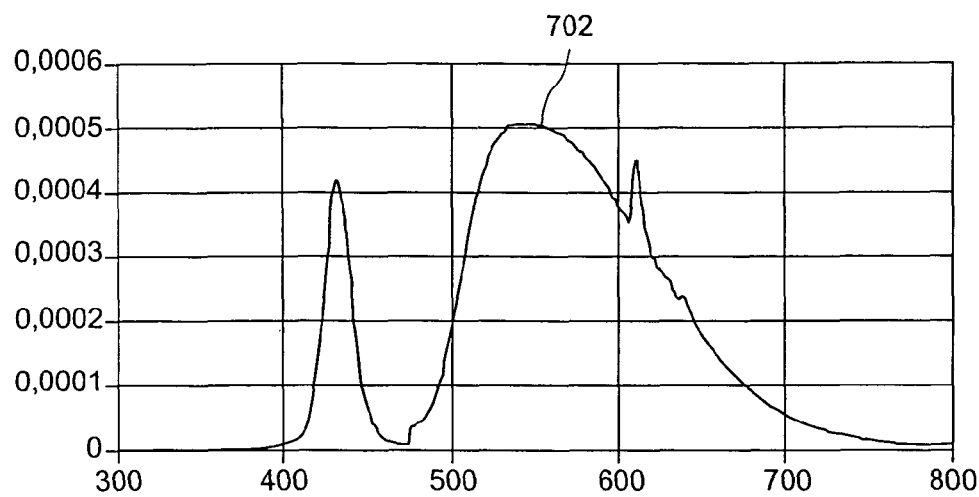
FIG. 8 is a graph of the broad spectrum produced by a phosphor converted blue LED.
Figure 9:
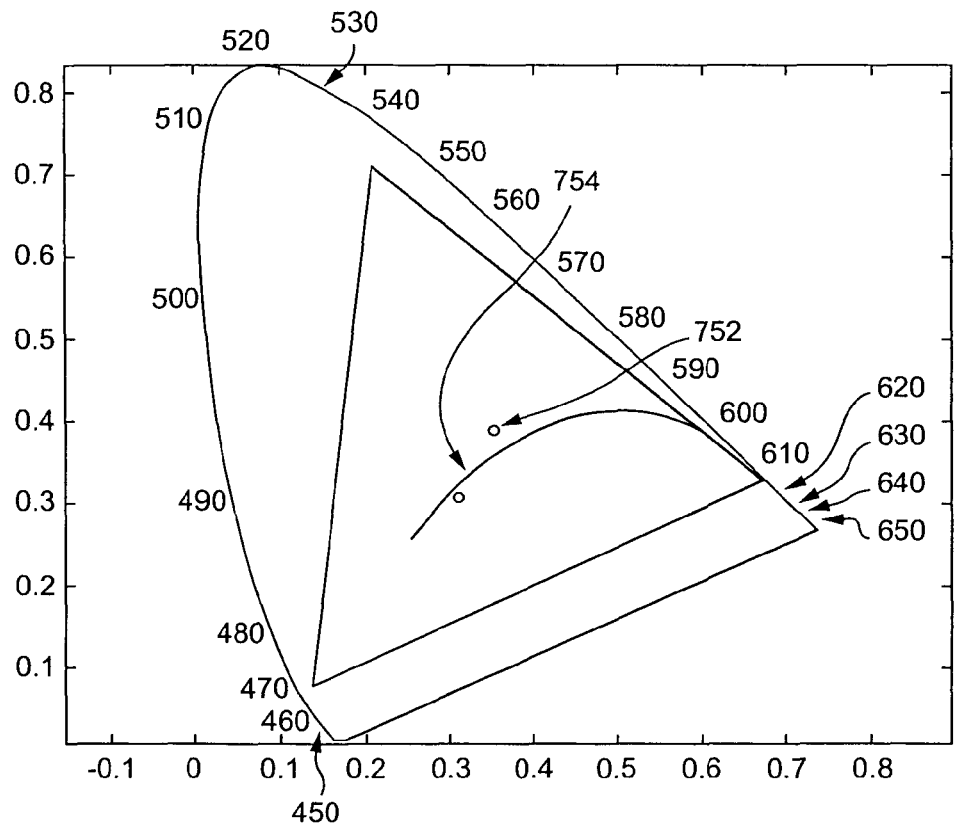
FIG. 9 is a CIE chromaticity diagram for the spectrum shown in FIG. 8.

As illustrated in FIG. 7, individual or groups of LEDs 602 may be independently controlled, e.g., by controller 610, which is electrically connected to the traces 606 on the board 604. By independently controlling LEDs 602 or groups of LEDs 602, a high color rendering, e.g., over 85, with a constant brightness may be achieved. Further, the white points produced by the array 600 may be tuneable over a large range of CCT, e.g., between 3000K and 6000K. By way of example, a number of phosphor-converted (PC) blue LEDs that produce white light may be used in combination with LEDs with different colors, such as blue, cyan, amber and red to produce a light with a desired CCT. As shown in the graph of FIG. 8, the phosphor converted blue LEDs generates light with a broad spectrum 702 in the green area in combination with a peak in the blue region. The thickness of the phosphor may be tuned to produce approximately equal peak values for both the green and blue parts of the spectrum. FIG. 9 shows a CIE chromaticity diagram for the spectrum shown in FIG. 8, which illustrates the x and y color coordinates 752 above the black bodyline 754. Of course, PC LEDs that produce spectra having peaks in other area may be used if desired. Alternatively, if desired, PC LEDs that produce different spectra, i.e., white light having different CCTs may be used together.

Figure 10:
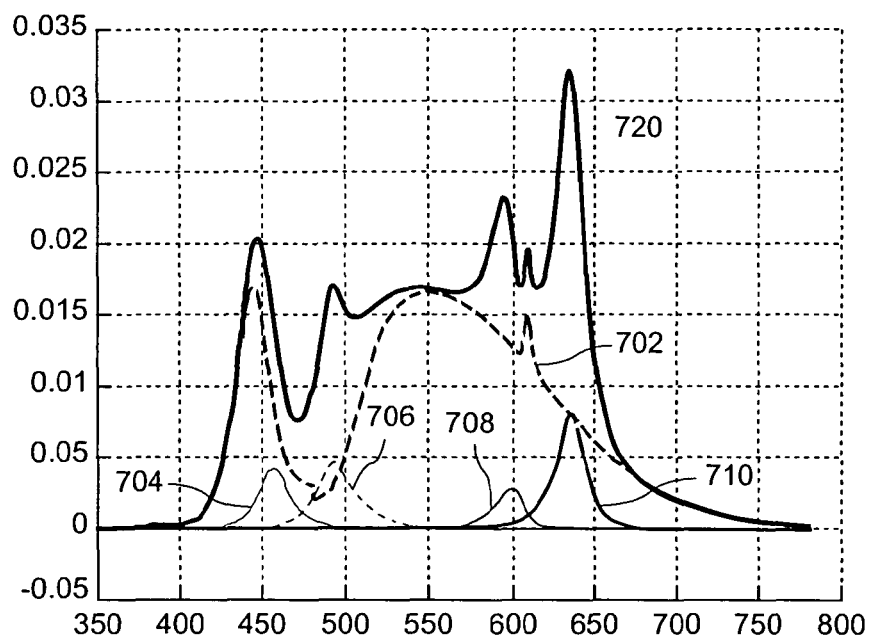
FIG. 10 is a graph of the spectra produced by phosphor converted LEDs and colored LEDs, which are combined to produce an approximately continuous spectrum.
Figure 11:
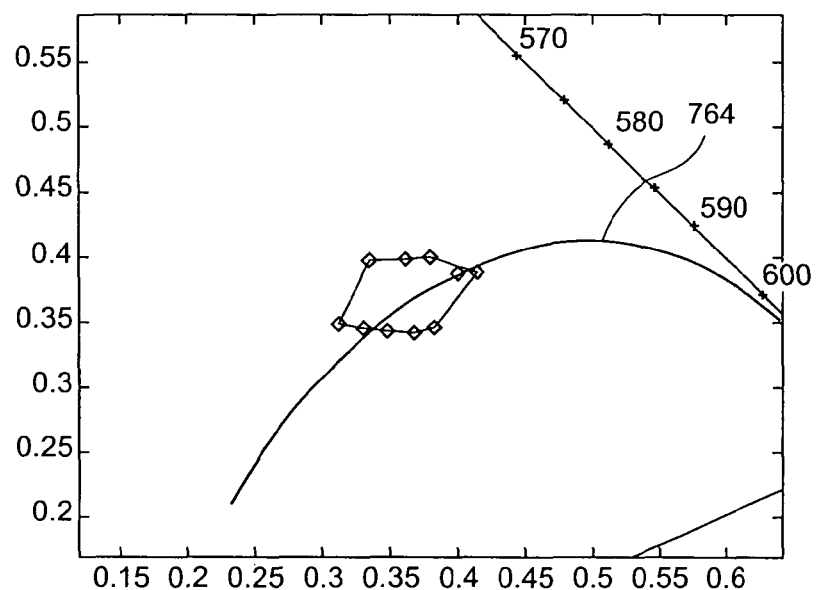
FIG. 11 is a portion of a CIE chromaticity diagram that shows the variation in the CCT that may be produced by varying the brightness of the colored LEDs.
Figure 12:
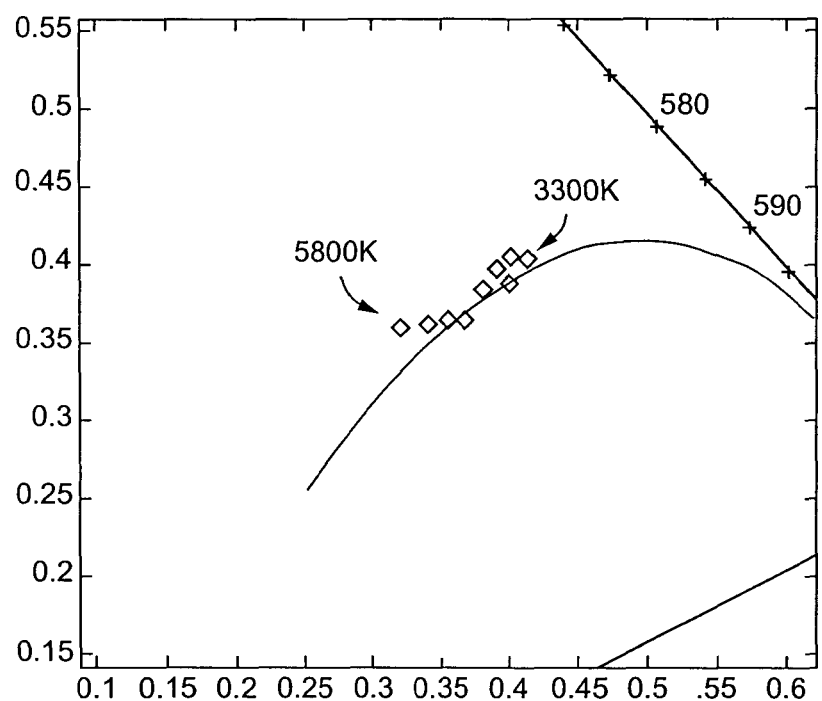
FIG. 12 is a portion of another CIE chromaticity diagram that illustrates variable CCT values for an array of 29 phosphor converted LEDs and 12 color LEDs.

A majority of the LEDs 602 in the array 600 of FIG. 7 may be PC LEDs that generate the spectrum shown in FIG. 8. The remaining LEDs 602 shown in FIG. 7 may be color LEDs, e.g., LEDs that produce blue, cyan, amber and red. The brightness of the color LEDs may be adjusted by controller 610. The combination of fully powered PC LEDs with colored LEDs generates an approximately continuous spectrum, as illustrated in FIG. 10. FIG. 10 shows a graph with the spectrum 702 from the PC LEDs along with spectra 704, 706, 708 and 710 from the blue, cyan, amber and red colored LEDs combined to form spectrum 720. As illustrated in the portion of the CIE chromaticity diagram shown in FIG. 11, by varying the brightness of the colored LEDs, an area that covers part of the black body line 764 can be obtained. By way of example, one embodiment that included 29 PC LEDs and 12 color LEDs is capable of producing a brightness of 800 lumen with a color rendering between 85 and 95 and a CCT between 3200K and 5800K. FIG. 12 illustrates a portion of the CIE chromaticity diagram that illustrates variable CCT values for an array of 29 PC LEDs and 12 color LEDs. Of course, any number of PC LEDs and color LEDs may be used.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. An apparatus comprising:
   a submount;
   a plurality of light emitting device dice mounted to the submount; and
   a single optical element attached to the plurality of light emitting device dice, wherein the single optical element is attached to the plurality of light emitting device dice by bonding the single optical element to a surface of each of the plurality of light emitting device dice.

2. The apparatus of claim 1, further comprising contact elements that are on at least one of the top surface of the submount and the bottom surfaces of the light emitting device dice, the light emitting device dice being electrically coupled to the submount through the contact elements.

3. The apparatus of claim 2, wherein the contact elements are formed from a material that includes at least one of Au and AuSn.

4. The apparatus of claim 1, further comprising a coating of wavelength converting material over the single optical element.

5. The apparatus of claim 1, further comprising a layer of wavelength converting material between the single optical element and at least a plurality of the light emitting device dice.

6. The apparatus of claim 1, wherein the submount and the single optical element are formed from materials with approximately the same coefficient of thermal expansion.

7. The apparatus of claim 6, wherein the light emitting device dice have coefficients of thermal expansion that are approximately the same as the coefficient of thermal expansion of the submount.

8. The apparatus of claim 1, further comprising a layer of a bonding material between the single optical element and each of the light emitting device dice, the bonding layer comprising an inorganic material.

9. The apparatus of claim 1, wherein each of the light emitting device dice comprise a stack of semiconductor layers, at least one of which is an active region that emits lights, and a first contact and a second contact electrically coupled to apply a voltage across the active region; the first contact and the second contact disposed on a same side of the stack.

10. A device comprising:
a semiconductor light emitting device comprising a stack of semiconductor layers including an active region;
an optical element bonded to the semiconductor light emitting device, wherein the optical element comprises a material selected from the group of aluminum oxynitride, spinel, and transparent alumina;
a bonding layer disposed between the optical element and the semiconductor light emitting device, wherein the bonding layer comprises an oxide of tellurium; and a submount electrically connected to the light emitting device.

11. The device of claim 10, wherein the submount comprises a ceramic.

12. The device of claim 10, wherein the submount comprises a material selected from the group of AlN, alumina, and Si.

13. The device of claim 10, further comprising contact elements that electrically connect the submount to the light emitting device, wherein the contact elements are formed from a material that includes at least one of Au and AuSn.

14. A device comprising: -4- Ser. No. 13/288,291 a semiconductor light emitting device comprising a stack of semiconductor layers including an active region; an optical element bonded to the semiconductor light emitting device, wherein the optical element comprises a material selected from the group of aluminum oxynitride, spinel, and transparent alumina; and a bonding layer disposed between the optical element and the semiconductor light emitting device, wherein the bonding layer comprises a material selected from the group of an oxide of lead, an oxide of tungsten, and an oxide of zinc.

15. The device of claim 14, further comprising a submount electrically connected to the light emitting device.

16. The device of claim 15, wherein the submount comprises a ceramic.

17. The device of claim 15, wherein the submount comprises a material selected from the group of AlN, alumina, and Si.

18. The device of claim 15, further comprising contact elements that electrically connect the submount to the light emitting device, wherein the contact elements are formed from a material that includes at least one of Au and AuSn.

* * * * *